(12) United States Patent
Meitl et al.

(10) Patent No.: US 10,074,768 B2
(45) Date of Patent: Sep. 11, 2018

(54) PRINTABLE INORGANIC SEMICONDUCTOR METHOD

(71) Applicant: X-Celeprint Limited, Cork (IE)

(72) Inventors: Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/179,380

(22) Filed: Jun. 10, 2016

(65) Prior Publication Data

US 2017/0025563 A1    Jan. 26, 2017

Related U.S. Application Data

(63) Continuation of application No. 14/807,311, filed on Jul. 23, 2015, now Pat. No. 9,368,683.

(51) Int. Cl.
*H01L 21/00*    (2006.01)
*H01L 33/00*    (2010.01)
(Continued)

(52) U.S. Cl.
CPC ...... *H01L 33/0079* (2013.01); *H01L 21/6835* (2013.01); *H01L 29/7848* (2013.01);
(Continued)

(58) Field of Classification Search
CPC ............ H01L 21/6835; H01L 29/7848; H01L 33/0079; H01L 33/0095; H01L 33/20;
(Continued)

(56) References Cited

U.S. PATENT DOCUMENTS 5,621,555 A    4/1997 Park
5,815,303 A    9/1998 Berlin
(Continued)

FOREIGN PATENT DOCUMENTS

WO    WO-2008/103931 A2    8/2008
WO    WO-2010/111601 A2    9/2010
(Continued)

OTHER PUBLICATIONS

Lee, S. H. et al., Laser Lift-Off of GaN Thin Film and its Application to the Flexible Light Emitting Diodes, Proc. of SPIE 8460:846011-1-846011-6 (2012).
(Continued)

*Primary Examiner* — Richard Booth
(74) *Attorney, Agent, or Firm* — William R. Haulbrook; Michael D. Schmitt; Choate, Hall & Stewart LLP

(57) ABSTRACT

A method of making an inorganic semiconductor structure suitable for micro-transfer printing includes providing a growth substrate and forming one or more semiconductor layers on the growth substrate. A patterned release layer is formed on the conductor layer(s) and bonded to a handle substrate. The growth substrate is removed and the semiconductor layer(s) patterned to form a semiconductor mesa. A dielectric layer is formed and then patterned to expose first and second contacts and an entry portion of the release layer. A conductor layer is formed on the dielectric layer, the first contact, and the second contact and patterned to form a first conductor in electrical contact with the first contact and a second conductor in electrical contact with the second contact but electrically separate from the first conductor. At least a portion of the release layer is removed.

19 Claims, 20 Drawing Sheets

(51) Int. Cl.
  *H01L 33/20* (2010.01)
  *H01L 33/40* (2010.01)
  *H01L 33/26* (2010.01)
  *H01L 29/78* (2006.01)
  *H01L 21/683* (2006.01)
  *H01L 33/32* (2010.01)
  *H01L 33/62* (2010.01)
  *H01L 33/38* (2010.01)
  *H01L 33/36* (2010.01)
  *H01L 33/44* (2010.01)

(52) U.S. Cl.
  CPC ........ *H01L 33/007* (2013.01); *H01L 33/0095* (2013.01); *H01L 33/20* (2013.01); *H01L 33/26* (2013.01); *H01L 33/32* (2013.01); *H01L 33/36* (2013.01); *H01L 33/38* (2013.01); *H01L 33/40* (2013.01); *H01L 33/44* (2013.01); *H01L 33/62* (2013.01); *H01L 2221/6835* (2013.01); *H01L 2221/68318* (2013.01); *H01L 2221/68322* (2013.01); *H01L 2221/68381* (2013.01); *H01L 2933/0016* (2013.01); *H01L 2933/0025* (2013.01); *H01L 2933/0033* (2013.01)

(58) Field of Classification Search
  CPC ......... H01L 33/26; H01L 33/32; H01L 33/38; H01L 33/40; H01L 33/62
  See application file for complete search history.

(56) References Cited

U.S. PATENT DOCUMENTS

| | | |
|---|---|---|
| 6,278,242 B1 | 8/2001 | Cok et al. |
| 6,287,940 B1 | 9/2001 | Cole et al. |
| 6,577,367 B2 | 6/2003 | Kim |
| 6,717,560 B2 | 4/2004 | Cok et al. |
| 6,756,576 B1 | 6/2004 | McElroy et al. |
| 6,933,532 B2 | 8/2005 | Arnold et al. |
| 6,953,977 B2 | 10/2005 | Mlcak et al. |
| 7,129,457 B2 | 10/2006 | McElroy et al. |
| 7,195,733 B2 | 3/2007 | Rogers et al. |
| 7,288,753 B2 | 10/2007 | Cok |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 9,209,348 B2 | 12/2015 | Hu et al. |
| 9,368,683 B1 | 6/2016 | Meitl et al. |
| 9,370,864 B2 | 6/2016 | Bibl et al. |
| 9,620,695 B2 | 4/2017 | Hu et al. |
| 9,640,715 B2 | 5/2017 | Bower et al. |
| 2010/0078656 A1 | 4/2010 | Seo et al. |
| 2010/0248484 A1 | 9/2010 | Bower et al. |
| 2010/0317132 A1 | 12/2010 | Rogers et al. |
| 2012/0228669 A1 | 9/2012 | Bower et al. |
| 2012/0314388 A1 | 12/2012 | Bower et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0084240 A1* | 3/2014 | Hu ............... H01L 25/0753 257/13 |
| 2014/0084482 A1 | 3/2014 | Hu et al. |
| 2014/0104243 A1 | 4/2014 | Sakariya et al. |
| 2014/0113404 A1 | 4/2014 | Rossini |
| 2014/0159065 A1 | 6/2014 | Hu et al. |
| 2014/0159066 A1 | 6/2014 | Hu et al. |
| 2014/0264763 A1 | 9/2014 | Meitl et al. |
| 2014/0267683 A1 | 9/2014 | Bibl et al. |
| 2014/0340900 A1 | 11/2014 | Bathurst et al. |
| 2014/0363928 A1 | 12/2014 | Hu et al. |
| 2014/0367633 A1 | 12/2014 | Bibl et al. |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0372187 A1 | 12/2015 | Bower et al. |
| 2016/0336488 A1 | 11/2016 | Bower et al. |
| 2017/0207364 A1 | 7/2017 | Bower et al. |

FOREIGN PATENT DOCUMENTS

| | | |
|---|---|---|
| WO | WO-2015/193436 A1 | 12/2015 |
| WO | WO-2016/184769 A1 | 11/2016 |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640 x 480 Pixel Computer Display Using Pin Diodes with Device Redundancy, 1988 International Display Research Conference, IEEE, CH-2678-1/88:152-154 (1988).

* cited by examiner

PRINTABLE INORGANIC SEMICONDUCTOR METHOD

PRIORITY APPLICATION

This application is a continuation of U.S. patent application Ser. No. 14/807,311, filed Jul. 23, 2015, entitled Printable Inorganic Semiconductor Method, which is hereby incorporated by reference.

CROSS REFERENCE TO RELATED APPLICATIONS

Reference is made to U.S. patent application Ser. No. 14/713,877 filed May 15, 2015, entitled Printable Inorganic Semiconductor Structure, the contents of which are incorporated by reference herein in their entirety.

FIELD OF THE INVENTION

The present invention relates to structures and methods for providing micro-light-emitting diodes on substrates that can be printed using massively parallel micro-transfer printing methods.

BACKGROUND OF THE INVENTION

Light-emitting diodes (LEDs) are widely used in the display industry as indicators and in small textual or graphic displays. More recently, LEDs are used in large, tiled outdoor displays and have been demonstrated for indoor applications. However, such displays are expensive to make, in part because of the need for small LEDs and the cost of locating small LEDs on a display substrate.

LEDs are formed in a semiconductor material, often using gallium nitride (GaN). These materials are deposited, with suitable doping, on a wafer substrate to form a crystalline structure that is the LED. Electrical contacts are then formed using photolithographic methods and the LED device is singulated from the wafer and packaged. Most LEDs are formed on a sapphire wafer rather than a gallium nitride wafer to reduce costs. However, the lattice structure of the sapphire wafer does not match that of the GaN LED crystal and therefore the crystal structure tends to have defects, reducing the performance and acceptability of the resulting LED.

Inorganic light-emitting diode displays using micro-LEDs (for example having an area less than 100 microns square or having an area small enough that it is not visible to an unaided observer of the display at a designed viewing distance) are known. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

In micro-transfer printing, small integrated circuit chips or chiplets are typically formed on a silicon substrate using photolithographic processes. The silicon substrate facilitates the formation of tethers between the wafer and the chiplet that are broken during the micro-transfer printing process. Although relatively inexpensive when compared to sapphire, silicon has an even larger lattice mismatch with the GaN crystal structures making up the LEDs than sapphire, further reducing the performance of the resulting LEDs. Thus, it is desirable to form printable integrated circuit structures, such as LEDs, using a sapphire substrate. However, there is no available method for undercutting a chiplet formed on a sapphire substrate to enable release of the chiplet for micro-transfer printing.

There is a need, therefore, for structures and methods that enable the construction of micro-LED chiplets formed on a sapphire substrate that can be micro-transfer printed. There is also a need for simple and inexpensive methods and structures enabling electrical interconnections for chiplets printed on destination substrates. Furthermore, there is a need for methods and structures that allow electrically connecting the electrical contacts of printed structures, such as printed LEDs, using fewer processing steps than conventional methods.

SUMMARY OF THE INVENTION

The present invention provides structures and methods that enable the construction of micro-devices formed on a sapphire substrate that can be micro-transfer printed. Such printed structures enable low-cost, high-performance arrays of electrically connected micro-devices (e.g., micro-LEDs) useful, for example, in display systems. For example, described herein are micro assembled arrays of micro devices, such as micro-LEDs, that are too small (e.g., micro LEDs with a width, length, height and/or diameter of 0.5 µm to 50 µm; e.g., a width of 1-8 µm, a length of 5-10 µm and a height of 0.5-3 µm), numerous, or fragile to be assembled by conventional means. Rather, these arrays are assembled using micro transfer printing technology. The micro-devices may be prepared on a native substrate and printed to a destination substrate (e.g., plastic, metal, glass, sapphire, transparent materials, or flexible materials), thereby obviating the manufacture of the micro-devices on the destination substrate.

In certain embodiments, formation of the printable micro device begins while the semiconductor structure remains on a substrate, such as a sapphire substrate. After partially forming the printable micro device, a handle substrate is attached to the system opposite the substrate such that the system is secured to the handle substrate. The substrate, such as the sapphire substrate, may then be removed from the system using various techniques, such as laser ablation, grinding, etching, and polishing. After the substrate is removed, formation of the semiconductor structure is completed to form the printable micro device. Upon completion, the printable micro device may be micro transfer printed to a destination substrate, thereby enabling parallel assembly of high-performance semiconductor devices (e.g., to form micro-LED displays) onto virtually any substrate material, including glass, plastics, metals, other semiconductor materials, or other non-semiconductor materials.

Microstructured stamps (e.g., elastomeric, electrostatic stamps, or hybrid elastomeric/electrostatic stamps) may be used to pick up the disclosed micro devices, transport the micro devices to the destination, and print the micro devices onto a destination substrate. In some embodiments, surface adhesion forces are used to control the selection and printing of these devices onto the destination substrate. This process may be performed massively in parallel. The stamps may be designed to transfer a single device or hundreds to thousands of discrete structures in a single pick-up and print operation. For a discussion of micro transfer printing generally, see U.S. Pat. Nos. 7,622,367 and 8,506,867, each of which is hereby incorporated by reference in its entirety.

Moreover, these micro transfer printing techniques may be used to print semiconductor devices at temperatures compatible with assembly on plastic polymer substrates. In addition, semiconductor materials may be printed onto large areas of substrates thereby enabling continuous, high speed printing of complex integrated electrical circuits over large substrate areas.

Fully flexible electronic devices with good electronic performance in flexed or deformed device orientations may be provided to enable a wide range of flexible electronic devices. The destination substrate may be flexible, thereby permitting the production of flexible electronic devices. Flexible substrates may be integrated in a large number of configurations, including configurations not possible with brittle silicon based electronic devices. Additionally, plastic substrates, for example, are mechanically rugged and may be used to provide electronic devices that are less susceptible to damage and/or electronic performance degradation caused by mechanical stress. Thus, these materials may be used to fabricate electronic devices by continuous, high-speed printing techniques capable of generating electronic devices over large substrate areas at low cost (e.g., roll-to-roll manufacturing).

In certain embodiments, the disclosed technology relates generally to advantageous interconnection architectures for micro-devices, such as micro-LEDs, as well as devices assembled with micro-devices, such as displays assembled via micro transfer printing. Typically, micro-devices are formed with terminals on different faces of the device. For example, micro-LEDs are formed with terminals on different faces of the micro-LED. This necessitates the step of depositing a vertical insulator between the terminals, e.g., in the robotic assembly of the LED display. For example, if one terminal is on the bottom and one terminal is on the top, the terminals occupy the same space in the x-y plane and a robust insulator is required.

In certain embodiments, micro-devices are assembled (e.g., via micro transfer printing) onto the insulator and holes are created in the insulator to access conductive wires below the insulator. A single level of interconnections is used to provide contact to the terminals of the micro-devices. Thus, this architecture reduces the number of levels required to form the display.

Fine lithography may be used to minimize the separation distance between the terminals (e.g., a separation distance of distance of 100 nm to 20 microns), thus increasing the size of the micro-device terminals. Minimizing the lateral separation between terminals and the micro-device and maximizing the size of the terminals (within the confines of the dimensions of the micro-device) maximizes the tolerance for registration and lithography errors between the assembled micro-devices and the relatively coarse conductive lines used to interconnect them on the display substrate.

In one aspect, the disclosed technology includes a method of making an inorganic semiconductor structure suitable for micro-transfer printing, the method including: providing a growth substrate; forming an n-doped semiconductor layer on the growth substrate; forming a p-doped semiconductor layer on the n-doped semiconductor layer; forming a conductor layer on the p-doped semiconductor layer; forming a patterned release layer on the conductor; bonding a handle substrate to the release layer; removing the growth substrate to expose the n-doped semiconductor layer; removing a portion of the n-doped and p-doped semiconductor layers to form a semiconductor mesa within the area defined by the patterned release layer; removing a portion of the conductor layer to form a conductor mesa beneath the semiconductor mesa that extends past at least one edge of the semiconductor mesa and exposes a portion of the patterned release layer around the conductor mesa; forming a dielectric layer on the exposed portions of the patterned release layer, conductor mesa, and semiconductor mesa; patterning the dielectric layer to expose a first contact on the semiconductor mesa, a second contact on the conductor mesa, and an entry portion of the patterned release layer; forming a conductive layer on the patterned dielectric layer, the first contact, and the second contact; patterning the conductive layer to form a first conductor in electrical contact with the first contact and a second conductor in electrical contact with the second contact, the first conductor electrically separate from the second conductor; and removing at least a portion of the patterned release layer.

In certain embodiments, forming the conductor layer includes forming a first conductive sub-layer having first conductive materials on the p-doped semiconductor layer and forming a second conductive sub-layer having second conductive materials on the first conductive sub-layer.

In certain embodiments, the first conductive materials include one or more of Pd, Au, Ni, Ti, Ag, Pt or combinations thereof.

In certain embodiments, the first conductive sub-layer is semi-transparent.

In certain embodiments, the second conductive materials include a transparent conductive oxide, a metal oxide, indium tin oxide, aluminum zinc oxide, silver, gold, nickel, titanium, tantalum, tin, or aluminum or combinations or alloys thereof.

In certain embodiments, the second sub-layer is thicker than the first conductive sub-layer.

In certain embodiments, the second sub-layer is less than or equal to 250 nm, 100 nm, 50 nm, or 20 nm thick.

In certain embodiments, the conductor layer is transparent.

In certain embodiments, the conductor layer is reflective.

In certain embodiments, forming the conductor layer includes physical vapor deposition or annealing.

In certain embodiments, forming the optional etch-stop layer includes depositing material by chemical vapor deposition, depositing silicon oxide, or depositing silicon nitride.

In certain embodiments, forming the release layer includes depositing Ge, Si, TiW, Al, Ti, W, Mo, polymer, or a lift-off resist.

In certain embodiments, removing at least a portion of the release layer includes etching the release layer portion with $H_2O_2$, $XeF_2$, HCl, TMAH, or O plasma.

In certain embodiments, providing the growth substrate includes providing a sapphire substrate, an $Al_2O_3$ substrate, a Si substrate, or a SiC substrate.

In certain embodiments, bonding the handle substrate includes forming a bonding layer between the handle substrate and the release layer or capping layer.

In certain embodiments, forming the bonding layer includes providing a layer of epoxy, resin, solder, or a material that includes Au or Sn.

In certain embodiments, removing the growth substrate and any buffer layer includes performing a laser lift-off, grinding, or etching.

In certain embodiments, forming the dielectric layer includes depositing silicon nitride or silicon oxide.

In certain embodiments, forming the conductor layer includes depositing a transparent conductive oxide, a metal oxide, indium tin oxide, aluminum zinc oxide, silver, gold, nickel, titanium, tantalum, tin, or aluminum.

In certain embodiments, forming the conductor layer includes depositing a transparent conductive oxide, a metal oxide, indium tin oxide, aluminum zinc oxide, silver, gold, nickel, titanium, tantalum, tin, or aluminum.

In certain embodiments, the growth substrate includes a buffer layer and comprising forming a buffer layer as part of the growth substrate.

In certain embodiments, providing the optional buffer layer includes providing a layer of doped or undoped GaN or doped or undoped AlGaN.

In certain embodiments, the conductor layer includes an etch-stop layer and comprising forming an etch-stop layer as part of the conductor layer.

In certain embodiments, the release layer includes a capping layer and comprising forming a capping layer as part of the release layer.

In certain embodiments, forming the optional capping layer includes depositing silicon nitride.

In certain embodiments, forming light-extraction features on the n-doped semiconductor layer.

In certain embodiments, the p-doped or n-doped semiconductor layers are GaN semiconductor layers.

In certain embodiments, the conductor layer and semiconductor layers form an optical cavity in which light emitted from the semiconductor layers constructively or destructively interferes at one or more desired emission frequencies.

In another aspect, the disclosed technology includes a method of making an inorganic semiconductor structure suitable for micro-transfer printing, the method including: providing a growth substrate; forming one or more semiconductor layers on the growth substrate; forming a patterned release layer on one or more of the semiconductor layers; bonding a handle substrate to the patterned release layer; removing the growth substrate; removing a portion of the semiconductor layer(s) to form a semiconductor mesa within the area defined by the patterned release layer; forming a dielectric layer on the exposed portions of the semiconductor mesa and patterned release layer; patterning the dielectric layer to expose first and second contacts, and an entry portion of the patterned release layer; forming a conductive layer on the patterned dielectric layer, the first contact, and the second contact; patterning the conductive layer to form a first conductor in electrical contact with the first contact and a second conductor in electrical contact with the second contact, the first conductor electrically separate from the second conductor; and removing at least a portion of the patterned release layer.

In certain embodiments, the method includes forming one or more conductor layers on the semiconductor layer(s) substrate, forming a conductor mesa beneath the semiconductor mesa that extends past the edges of the semiconductor mesa and exposes a portion of the release layer on every side of the conductor mesa, and wherein the second contact is on the one or more conductor layers.

In certain embodiments, the semiconductor layers include one or more light-emitting layers and a current-transport layer adjacent to the release layer that extends beyond the light-emitting layers and wherein the second contact is on the current-transport semiconductor layer.

In certain embodiments, the conductor layer and semiconductor layers form an optical cavity in which light emitted from the semiconductor layers constructively or destructively interferes at one or more desired emission frequencies.

In another aspect, the disclosed technology includes a method of making an inorganic semiconductor structure suitable for micro-transfer printing, the method including: providing a growth substrate; forming one or more semiconductor layers on the growth substrate; forming a patterned release layer on one or more of the semiconductor layers; bonding a handle substrate to the patterned release layer; removing the growth substrate; removing a portion of the semiconductor layer(s) to form a semiconductor mesa within the area defined by the patterned release layer; forming a dielectric layer on the exposed portions of the semiconductor mesa and patterned release layer; patterning the dielectric layer to expose at least a first contact and an entry portion of the patterned release layer; forming a conductive layer on the patterned dielectric layer and the first contact; patterning the conductive layer to form a first conductor in electrical contact with the first contact; and removing at least a portion of the patterned release layer.

In certain embodiments, the method includes forming one or more conductor layer(s) on the one or more semiconductor layers and then removing a portion of the conductor layer(s) to form a conductor mesa within the area defined by the patterned release layer.

In certain embodiments, the conductor layer and semiconductor layers form an optical cavity in which light emitted from the semiconductor layers constructively interferes at a desired emission frequency.

In certain embodiments, the handle substrate is a glass, metal, or plastic. In certain embodiments, the handle substrate is a wafer, for example a semiconductor wafer.

In certain embodiments, the source or growth substrate is a sapphire substrate.

In certain embodiments, the semiconductor layer or layers comprises GaN and/or doped GaN.

In certain embodiments, the semiconductor layer comprises multiple sub-layers.

In certain embodiments, removing the growth substrate comprises removing the growth substrate using laser ablation.

In certain embodiments, the method includes removing a portion of the semiconductor layer or layers to expose a portion of the first electrical contact.

In certain embodiments, the semiconductor element, the first electrical contact, and the second electrical contact form a diode, a laser, or a light-emitting diode.

In certain embodiments, the structure includes one or more additional electrical contacts, wherein the semiconductor element, the first electrical contact, and the second electrical contact and the one or more additional electrical contacts form a transistor and integrated circuit.

In certain embodiments, the semiconductor structure has a width from 1-8 μm.

In certain embodiments, the semiconductor structure has a length from 5-10 μm.

In certain embodiments, the semiconductor structure has a height from 0.5-3 μm.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
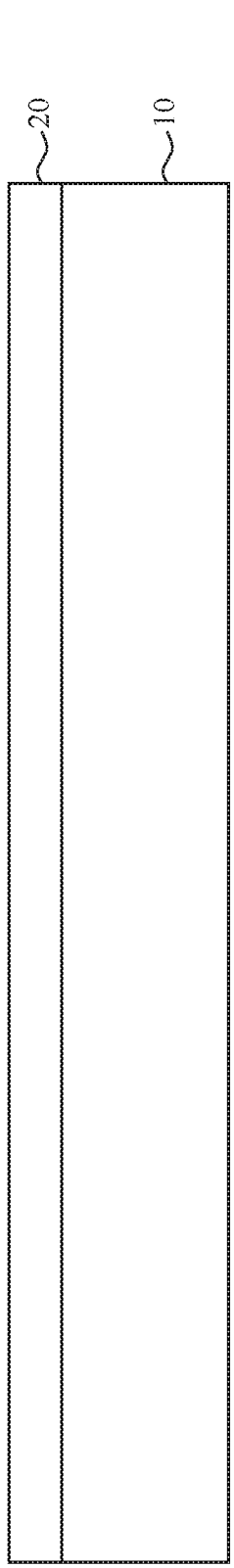
FIGS. 1-18 are cross sections illustrating sequential steps in a method according to embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides structures and methods that enable the construction on a substrate of micro-LED chiplets that can be micro-transfer printed. Such printed structures enable low-cost, high-performance arrays of electrically connected micro-LEDs useful, for example, in display systems. Various semiconductor elements may be formed using the methods and techniques described here, including diodes (e.g., micro-diodes), lasers (micro-lasers), and light-emitting diodes (e.g., micro-LEDs). In general, the steps of the present invention are performed using photolithographic methods known in the integrated circuit arts, for example using deposition methods including evaporation, sputtering, and coating (e.g. spin coating and curtain coating) of metals and polymers, and layer patterning methods including photoresist deposition, patterned exposure to radiation, curing, developing, etching, and stripping.

FIGS. 1-18 are diagrams illustrating the step-by-step fabrication of a printable semiconductor element that can be picked up by a micro transfer device. FIGS. 19-22 are alternative structures made by the same, or a similar, process. FIG. 23 is a flowchart illustrating a series of steps (e.g., in sequential order) corresponding to the fabrication of a printable semiconductor element as shown in FIGS. 1-18 and 19-22.

Referring to FIGS. 1 and 23, a growth substrate 10 is provided in step 100. The growth substrate 10 is a substrate on which the printable semiconductor element is formed (is grown or constructed) and is also considered to be a native source substrate for the printable semiconductor element. In some embodiments, the growth substrate 10 is a wafer substrate, such as sapphire wafer. Sapphire is a useful substrate because it has a lattice structure more closely matched to that of GaN (useful for LEDs) than silicon. Commercially available wafer substrates in a variety of material types and sizes can be used, for example an $Al_2O_3$ substrate, a Si substrate, or a SiC substrate. For the purpose of this description, growth substrate 10 can be described as a wafer.

An optional buffer layer 20 is formed on the growth substrate 10 in optional step 105 and as illustrated in FIG. 1. The buffer layer 20 is useful for subsequent processing steps, e.g., for growth substrate 10 removal, to enable reuse of the growth substrate 10, or to improve crystal lattice matching between the semiconductor element and the growth substrate 10. Useful buffer layer 20 materials can include doped or undoped GaN or doped or undoped AlGaN. The buffer layer 20 can be considered as part of the growth substrate 10 or as a separate layer formed on the growth substrate 10.

Figure 2:
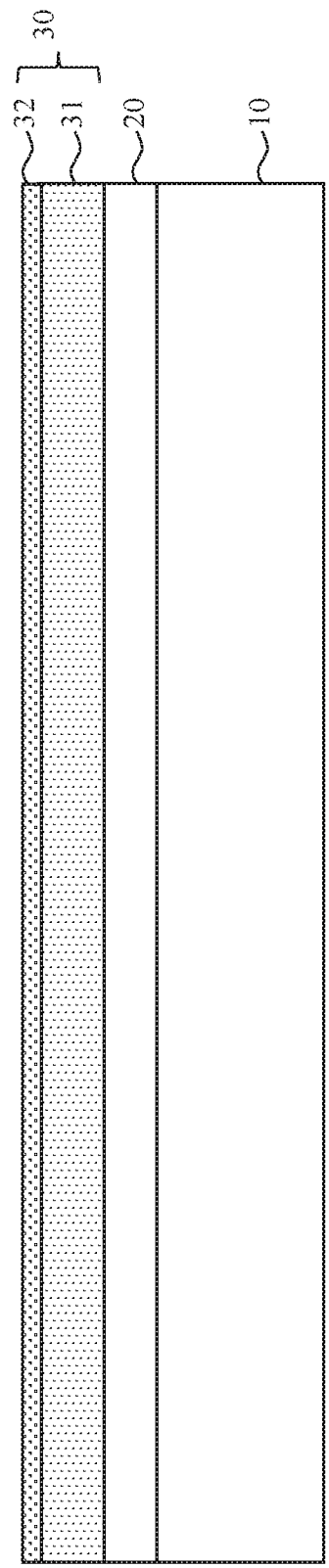

As illustrated in FIG. 2, one or more semiconductor layers 30 are formed on the growth substrate 10 or on the buffer layer 20, if the buffer layer 20 is present. The semiconductor layers 30 can include an n-doped semiconductor layer 31 (also known as an n-type semiconductor layer 31) deposited in step 110 on the growth substrate 10 or on the buffer layer 20, if the buffer layer 20 is present. In step 115, a p-doped semiconductor layer 32 (also known as a p-type semiconductor layer 32) is deposited on the n-doped semiconductor layer 31. In an embodiment, the n- and p-doped semiconductor layers 31, 32 are GaN semiconductor layers. Although the n- and p-doped semiconductor layers 31, 32 are illustrated for clarity as GaN semiconductor layers in FIG. 23 and the corresponding parts list, the present invention is not limited to GaN semiconductor layers and other semiconductors are contemplated as part of the present invention. The p-doped semiconductor layer 32 can be thinner than the n-doped semiconductor layer 31.

The n-doped and p-doped semiconductor layers 31, 32 can be located on the growth substrate 10 or buffer layers 20, in some embodiments, by forming crystalline layers using molecular beam epitaxy (MBE) or metal organic chemical vapor deposition (MOCVD). The n-doped and p-doped semiconductor layers 31, 32 can be further processed, if necessary, to provide crystalline semiconductor layers 30. In some embodiments, the n-doped and p-doped semiconductor layers 31, 32 are crystalline GaN. The GaN material can be doped, for example, with magnesium to form a p-type semiconductor layer 32 or with silicon or oxygen to form an n-type semiconductor layer 31. The n-doped and p-doped semiconductor layers 31, 32 can be formed having sub-layers with different concentrations of different material, for example, to provide different sub-layers having different electrical properties. In some embodiments and with further reference to FIG. 20 described below, the semiconductor layers 30 include a current-transport semiconductor layer 33 doped to provide increased electrical conductivity or transparency and one or more other semiconductor layers 30 are doped to provide light-emitting properties in response to an electrical current passing through the semiconductor crystal (e.g., n-doped and p-doped semiconductor layers 31, 32).

Figure 3:
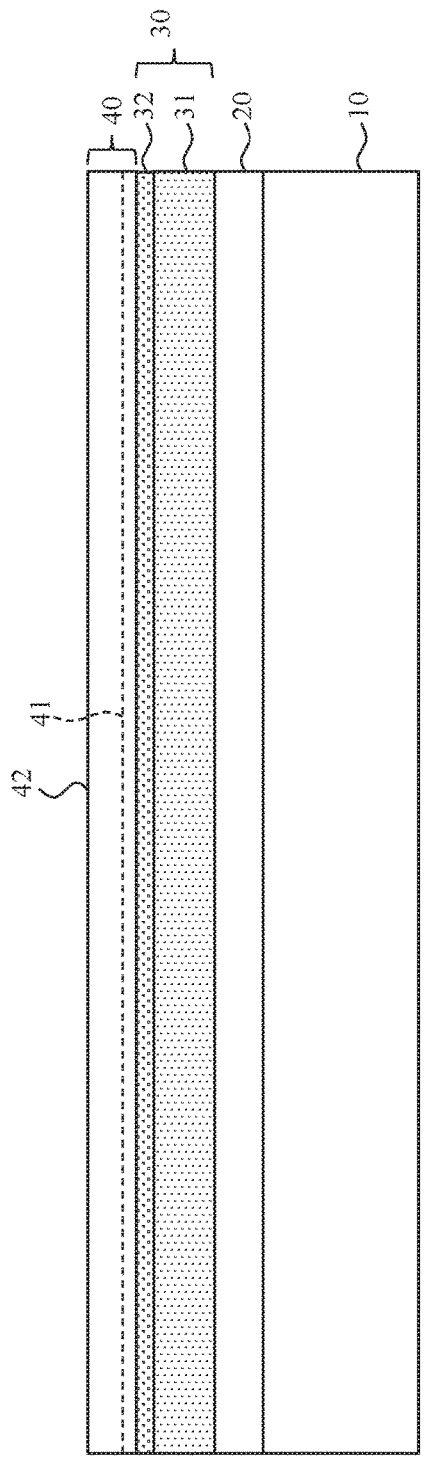

Referring next to FIG. 3, in one embodiment of the present invention in step 120 a conductor layer 40 is formed on the p-doped semiconductor layer 32. The conductor layer 40 is an electrode layer that supplies current to the semiconductor layer 30. In another embodiment of the present invention, the conductor layer 40 is a current-transport semiconductor layer 33 and the step 120 forms the current-transport semiconductor layer 33, as will be discussed further below with respect to FIG. 20. The conductor layer 40 can be a single layer or can include multiple sub-layers. The conductor layer 40 can be transparent, semi-transparent, or reflective and can include conductive materials such as metal oxides, indium tin oxide, aluminum zinc oxide, metals, silver, tin, aluminum, gold, titanium, tantalum, nickel, tin, platinum, palladium, or combinations or alloys thereof of these or other conductive materials. The conductor layer 40 can include conductive polymers. The conductor layer 40 can be formed using physical vapor deposition or annealing. The conductor layer 40 can be a semiconductor.

The conductor layer 40 can include a first conductive sub-layer 41 including first conductive materials such as those listed above and a second conductive sub-layer 42 including second conductive materials such as those listed above. The first conductive sub-layer 41 can be semi-transparent, and can be located between the second conductive sub-layer 42 and the p-doped semiconductor layer 32 so that the first conductive sub-layer 41 having first conductive materials is disposed on the p-doped semiconductor layer 32 and the second conductive sub-layer 42 having second conductive materials is disposed on the first conductive sub-layer 41. The first and second materials can include different materials or can have only some materials in common. The second conductive sub-layer 42 can be thicker than the first conductive sub-layer 41, for example having a thickness that is less than or equal to 250 nm, 100 nm, 50 nm, or 20 nm thick.

In an embodiment of the present invention, the first conductive sub-layer 41 can be semi-transparent and the thickness of the second conductive sub-layer 42 is chosen to complement the thickness of the semiconductor layer(s) 30 so that the second conductive sub-layer 42 and the semiconductor layer(s) 30 form an optically resonant cavity that constructively or destructively interferes at one or more desired frequencies, for example the frequency at which any light-emitting semiconductor layers 30 emit light (e.g., the n-doped and p-doped semiconductor layers 31, 32) or are desired to emit light or a desired frequency of ambient light to be rejected. Such an optical cavity can enhance the color purity of the emitted light (for example improving the color gamut of a display using the semiconductor element), can increase the amount of light output by reducing total internal reflection, can control the desired direction of light emission and the viewing angle of any emitted light, or can reject ambient light of a particular frequency.

Figure 4:
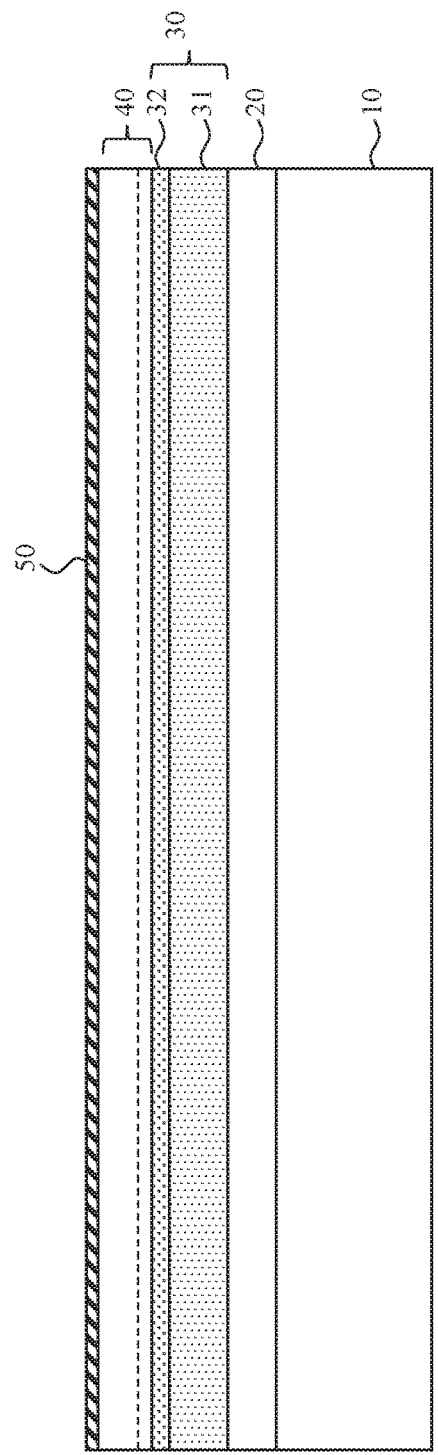

An optional etch-stop layer 50 is formed on the conductor layer 40, if present, or on a semiconductor layer 30 in optional step 125 and as illustrated in FIG. 4. In an embodiment, the etch-stop layer 50 is deposited using chemical vapor deposition, for example of a silicon oxide or silicon nitride. The etch-stop layer 50 is useful for subsequent processing steps, e.g., for patterning the semiconductor layer(s) 30 or the conductor layer 40, if present, without removing other layers and to provide a wide process tolerance for etching steps.

Figure 5:
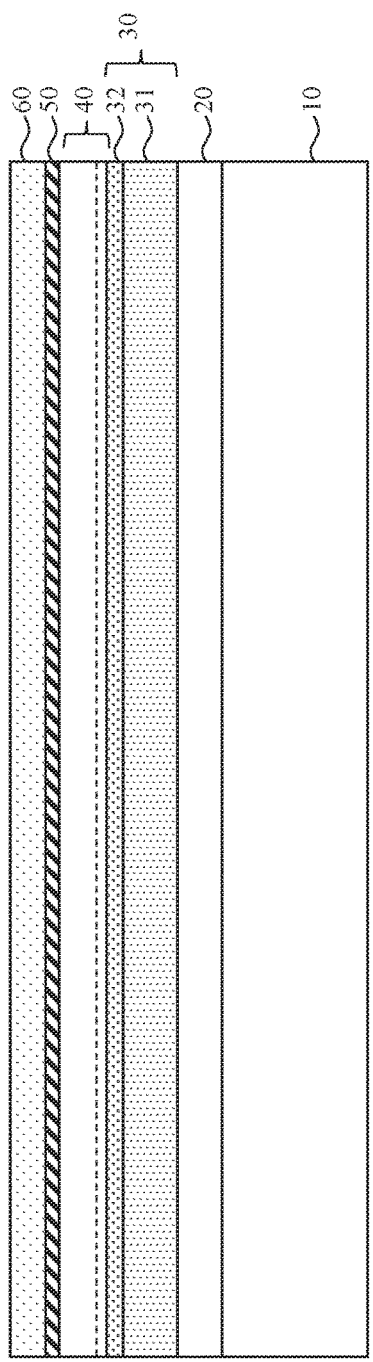
Figure 6:
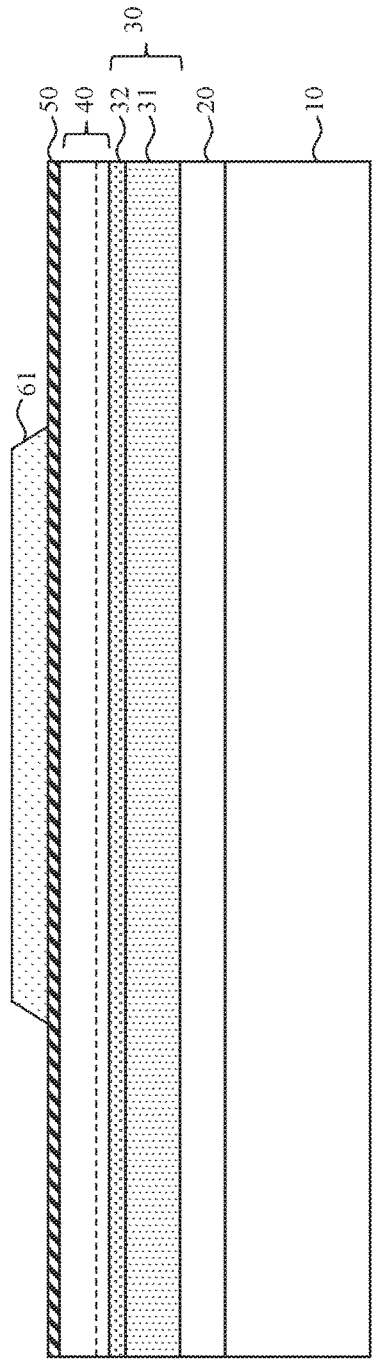

In step 130 and as illustrated in FIG. 5, a release (sacrificial) layer 60 is formed on the conductor layer 40 or on a semiconductor layer 30 (FIG. 20) and patterned (FIG. 6) to form a patterned release layer 61 formed on only a portion of the semiconductor and conductor layers 30, 40. In an embodiment, the patterned release layer 61 on the growth substrate 10 forms a plurality of separate release layer structures for example in an array. The release layer 60 can be formed of or include Ge, Si, TiW, Al, Ti, polymer, or a lift-off resist. In some embodiments, the release layer 60 is an inorganic dielectric or a metal. In other embodiments, the release layer 60 is Si (111), InAlP, InP, GaAs, InGaAs, AlGaAs, GaSb, GaAlSb, AlSb, InSb, InGaAlSbAs, InAlSb, or InGaP.

Figure 7:
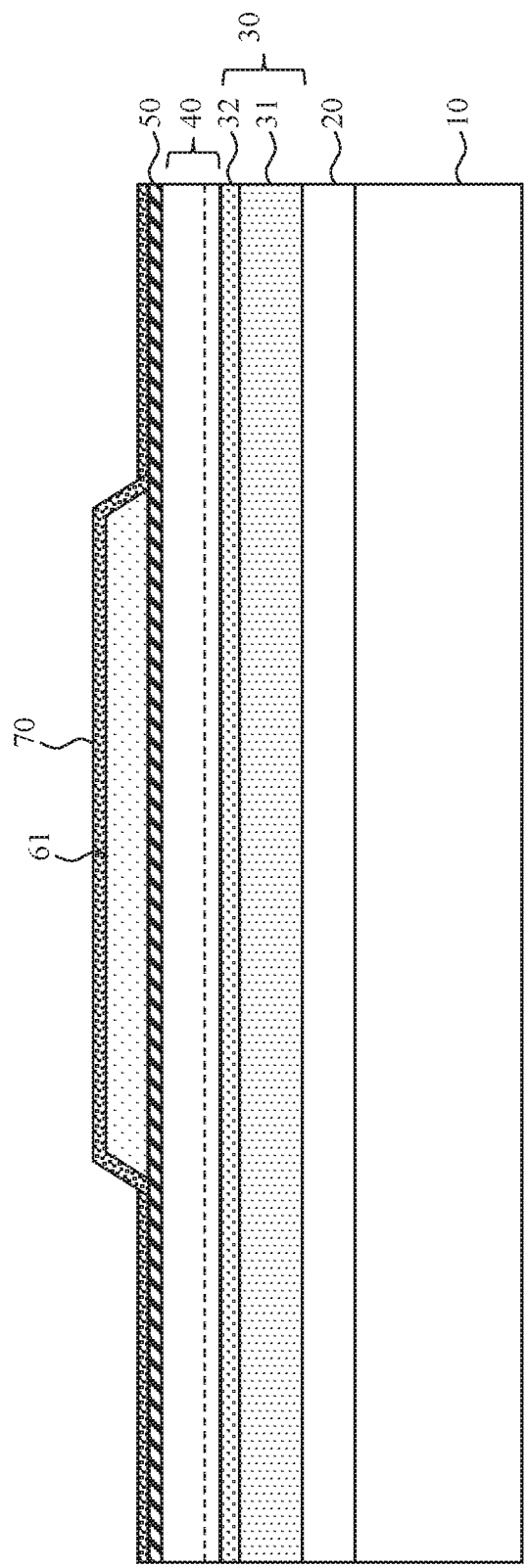

Referring to FIG. 7, an optional capping layer 70 is formed on the patterned release layer 61 in optional step 135. In an embodiment, the capping layer 70 is deposited, for example using chemical vapor deposition, for example of a silicon oxide or silicon nitride. The capping layer 70 is useful for subsequent processing steps, e.g., for removing the patterned release layer 61 without disturbing layers on a side of the capping layer 70 opposite the patterned release layer 61 or the etch-stop layer 50 and to provide a wide process tolerance for etching steps.

Figure 8:
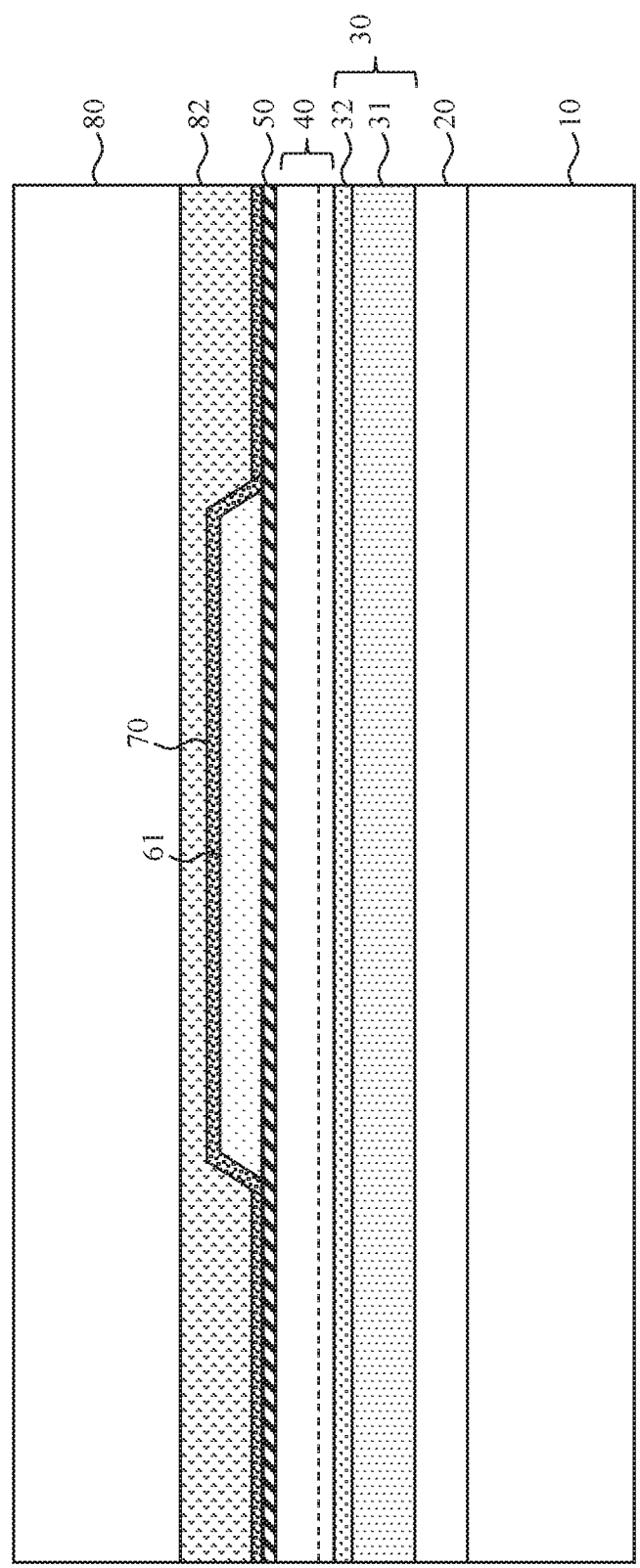

In step 140 and as illustrated in FIG. 8, a handle substrate 80 is bonded to the patterned release layer 61 or capping layer 70, if present, for example with a bonding layer 82 including an adhesive, such as a layer of epoxy, resin, plastic, solder, or a material that includes Au or Sn or metal alloys. In some embodiments, the handle substrate 80 is a handle wafer 80. The handle substrate 80 can be, for example, a glass, metal, or plastic substrate or a wafer, for example a silicon wafer. The bonding layer 82 can be coated on the handle substrate 80 and pressed against the capping layer 70 or patterned release layer 61 to adhere the handle substrate 80 to the patterned release layer 61 or capping layer 70, if present. Alternatively, the bonding layer 82 can be coated on the capping layer 70, if present, or the patterned release layer 61 and then pressed against the handle substrate 80 to adhere the handle substrate 80 to the patterned release layer 61 or capping layer 70, if present. The bonding layer 82 can conform to the patterned release layer 61 or capping layer 70 surface structure, for example by reflowing or because the bonding layer 82 is coated as a viscous liquid, and then cured or partially cured to form an adhesive bond once in place.

Figure 9:
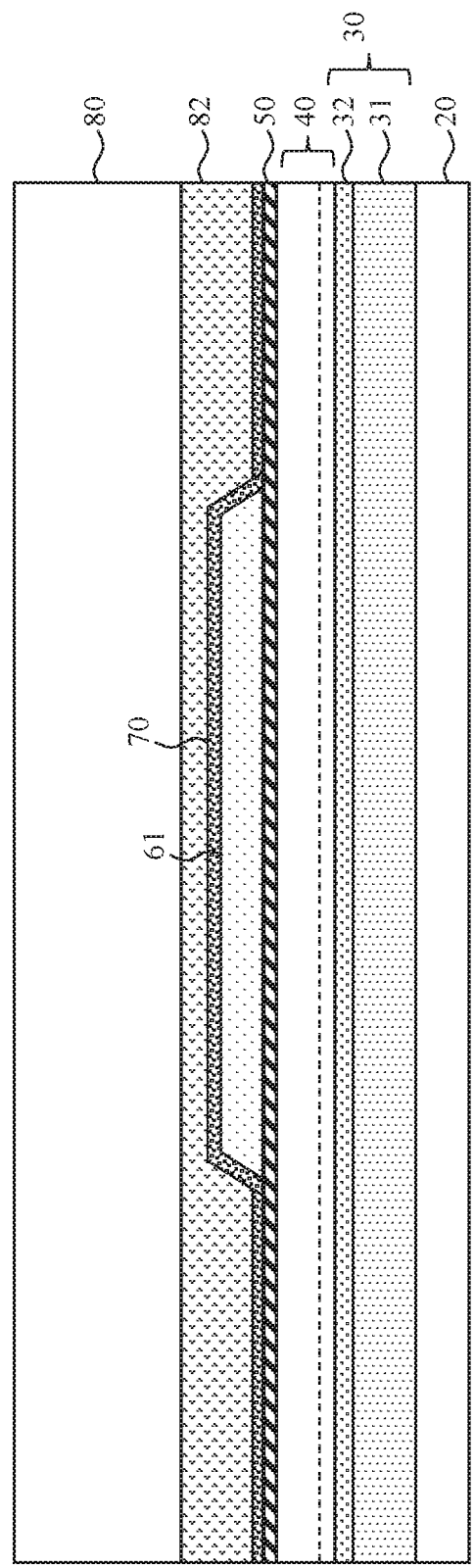
Figure 10:
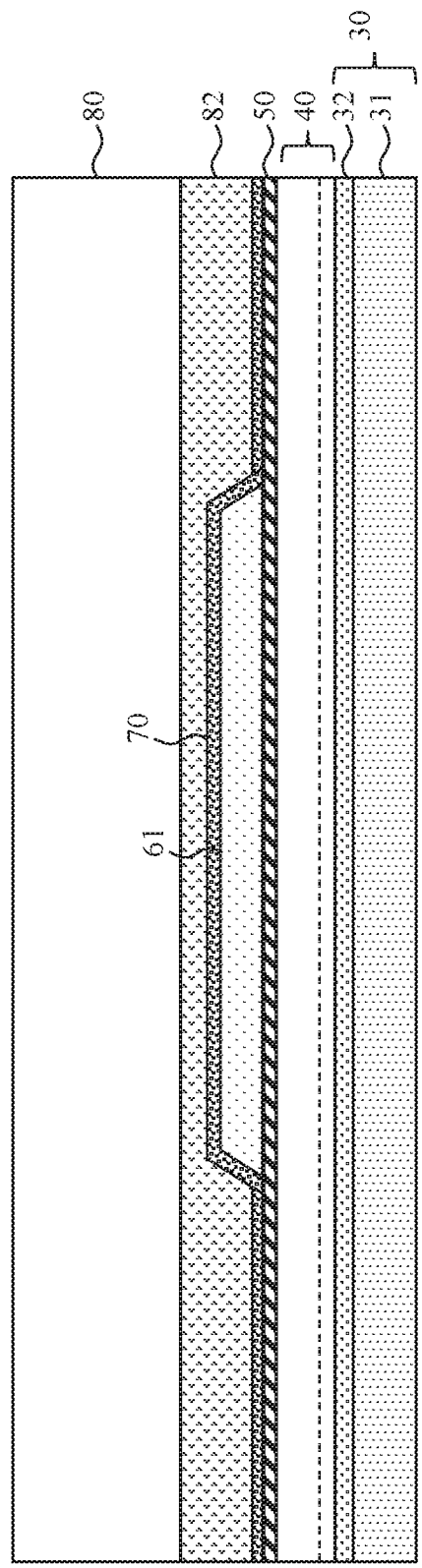

In step 145, the growth substrate 10 is removed, as shown in FIG. 9, together with any buffer layer 20, FIG. 10, to expose the n-doped semiconductor layer 31. In various embodiments, the growth substrate 10 is removed by performing a laser lift-off, by grinding, or by etching.

Figure 11:
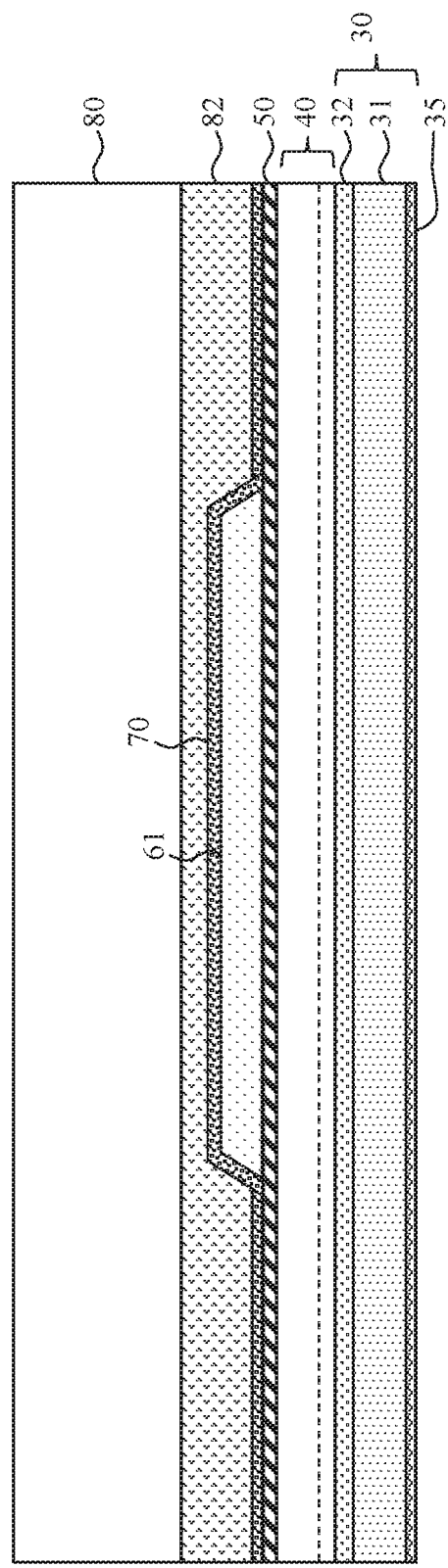

As shown in FIG. 11, in optional step 150 a surface of the n-doped semiconductor layer 31 is processed to form a structured surface 35 having light-extraction features. Such a structured surface 35 can be formed by pattern-wise etching the n-doped semiconductor layer 31 surface using photolithographic methods to make, for example pyramidal structures, axicons, lenslets, diffusers, or other reflective or refractive features. Since semiconductors have an optical index much higher than air, light emitted in semiconductors can be trapped in the semiconductors due to total internal reflection. Light-extraction features can reduce the amount of trapped light in the semiconductors and improve the efficiency of the light emitter.

Figure 12:
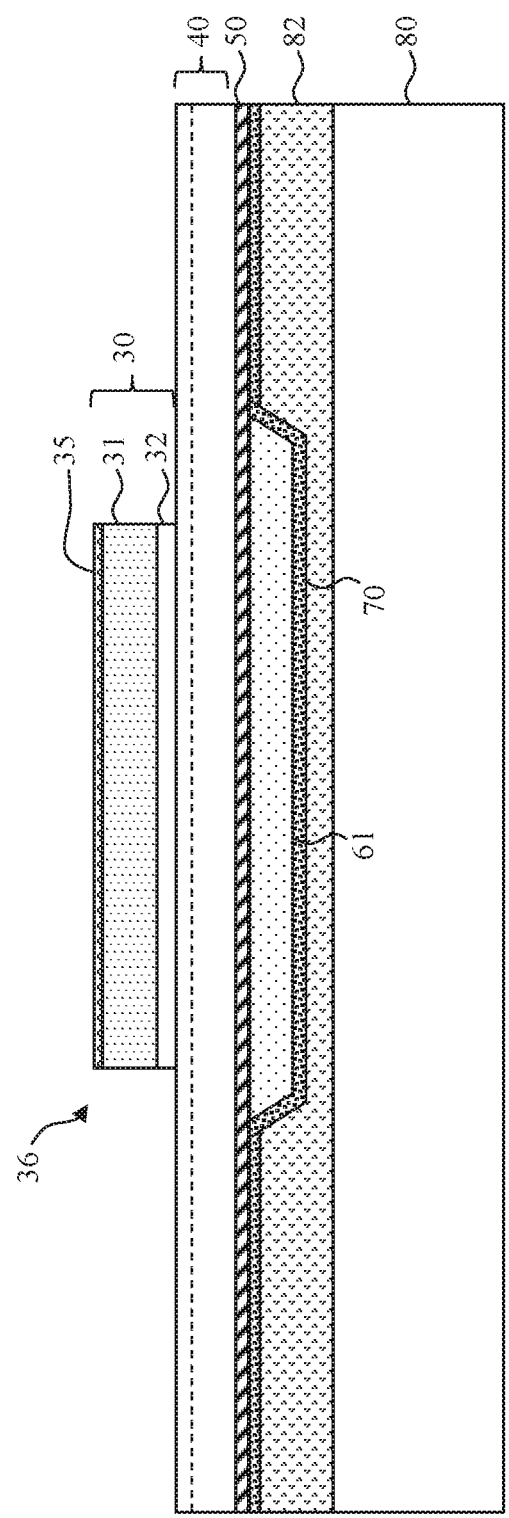

In step 155 and as illustrated in FIG. 12, the semiconductor layers 30 are patterned, for example by etching, to form a semiconductor mesa 36 within the area defined by the patterned release layer 61 so that the semiconductor mesa 36 does not extend beyond the area defined by the patterned release layer 61. As with the patterned release layer 61, a plurality of such semiconductor mesas 36 can be defined, each located within the area defined by a corresponding patterned release layer 61 structure of an array of separate patterned release layer 61 structures. If the semiconductor layers 30 include a current-transport semiconductor layer 33 (FIG. 20), the current-transport semiconductor layer 33 can be, but is not necessarily patterned with the other semiconductor layers 30 (e.g., the n- and p-doped semiconductor layers 31, 32) for example in a multi-step multi-pattern etching process; the current-transport semiconductor layer 33 also does not extend beyond the area defined by the patterned release layer 61.

Figure 13:
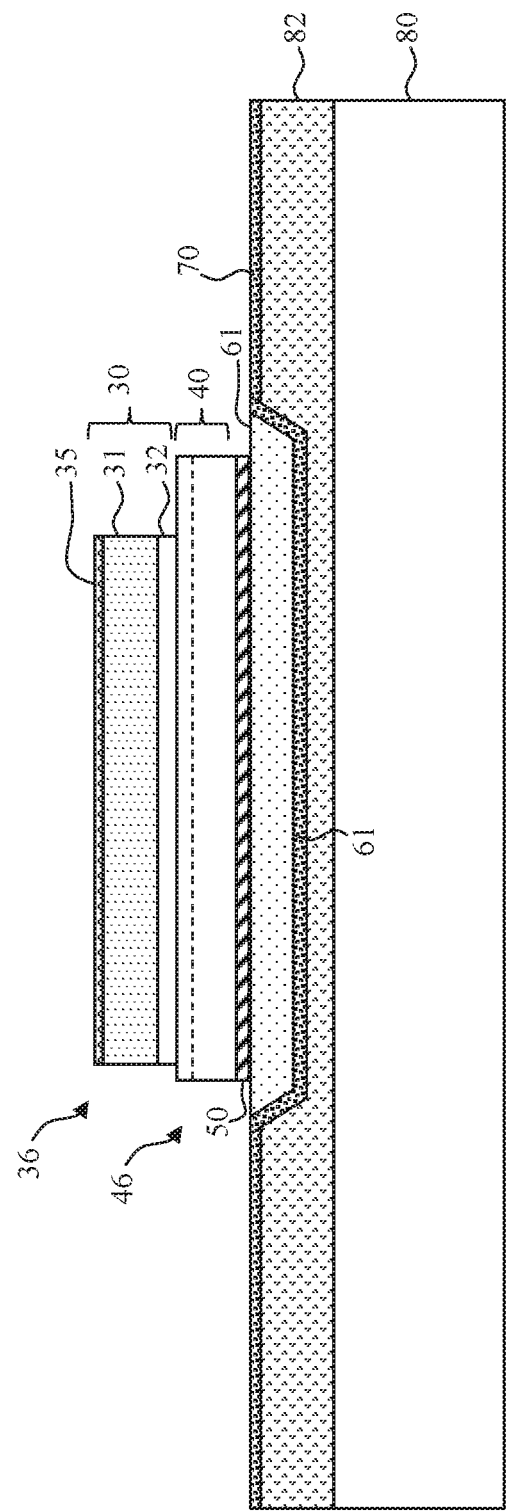

Similarly, in step 160 and as illustrated in FIG. 13, a portion of the conductor layer 40 and any etch-stop layer 50 is removed to form a conductor mesa 46 beneath the semiconductor mesa 36 that extends past at least one edge of the semiconductor mesa 36 and exposes a portion of the patterned release layer 61 around the conductor mesa 46. Alternatively, in the absence of the conductor layer 40, the step applies to the current-transport semiconductor layer 33 as discussed with respect to FIG. 20.

Figure 14:
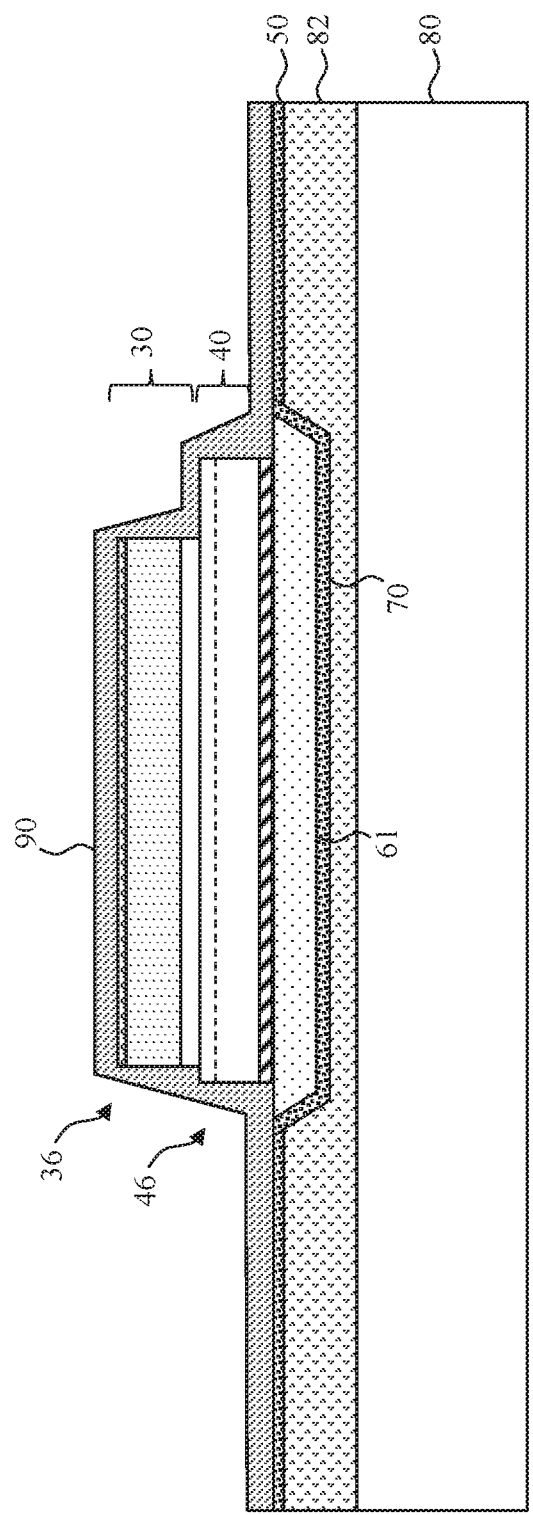
Figure 15:
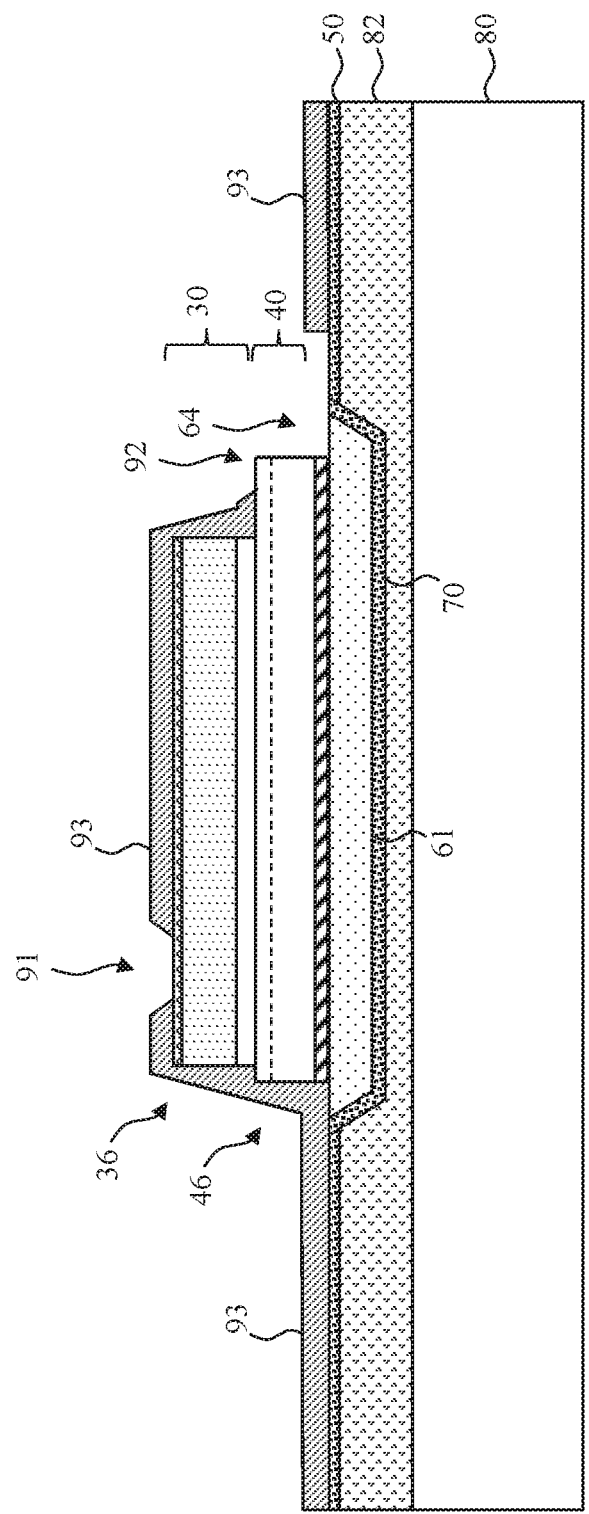

Referring next to FIG. 14, a dielectric layer 90 is formed on the semiconductor and conductor mesas 36, 46 and the exposed portions of the patterned release layer 61 in step 165 and then patterned in step 170, as shown in FIG. 15, to expose a first contact 91 on the semiconductor mesa 36, a second contact 92 on the conductor mesa 46, and an entry portion 64 of the patterned release layer 61. The first and second contacts 91, 92 are electrical contacts. The dielectric layer 90 patterning step 170 can also be used to form tethers, anchors, and vias useful for forming structures amenable to micro transfer printing or to form electrical connections. Suitable dielectric materials can be organic or inorganic and can include silicon oxides or silicon nitrides, polymers, or resins, for example curable resins.

Figure 16:
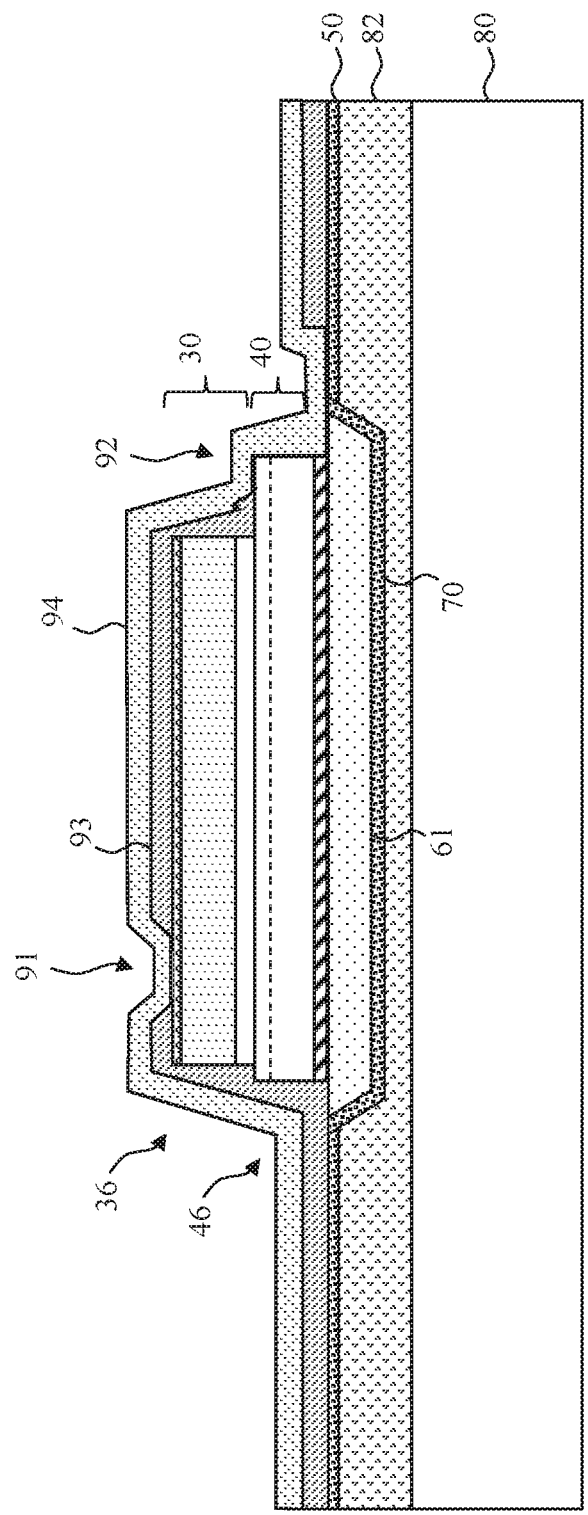
Figure 17:
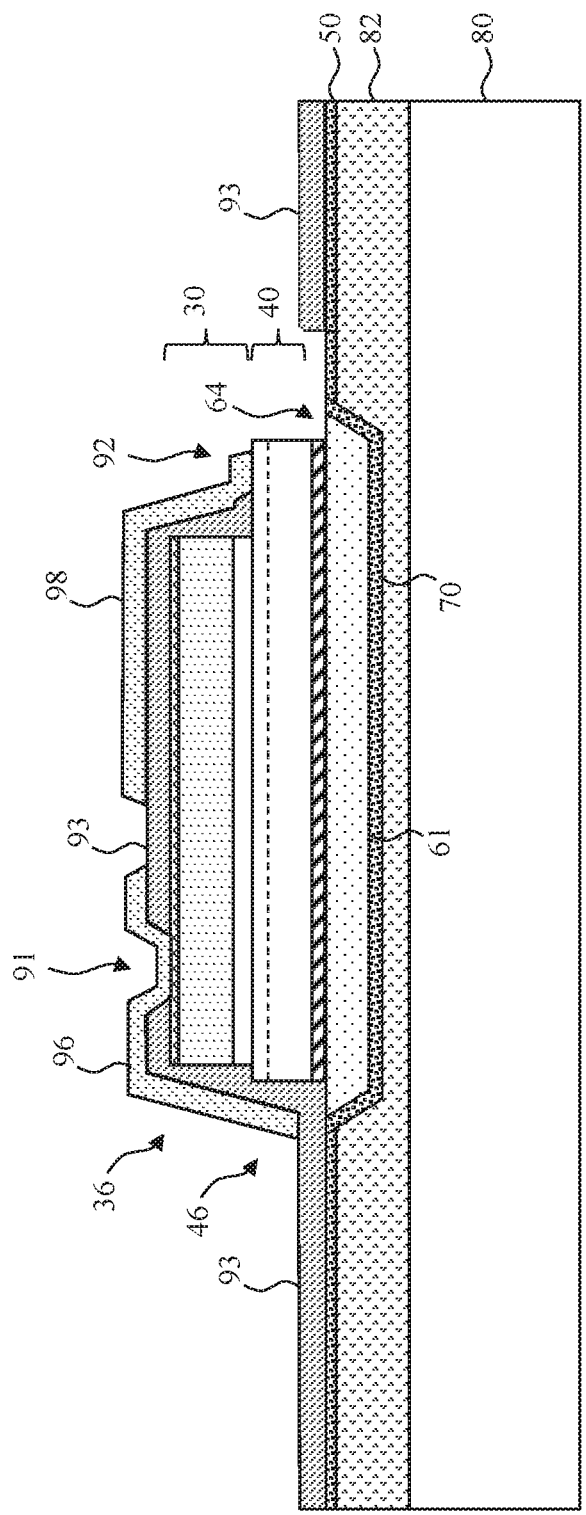

As shown in FIG. 16, in step 175 a conductive layer 94, for example a reflective metal layer, is formed on the patterned dielectric layer 93, the first contact 91, and the second contact 92. A reflective metal layer can assist in forming an optical cavity for the semiconductor layers 30 and conductor layers 40. The conductive layer 94 is then patterned in step 180 (FIG. 17) to form a first conductor 96 in electrical contact with the first contact 91 and a second conductor 98 in electrical contact with the second contact 92. The first conductor 96 is electrically separate from the second conductor 98. By electrically separate as intended herein is that the first conductor 96 is not directly connected to the second conductor 98. Although electrically separate, the first conductor 96 is electrically connected to the second conductor 98 through the conductor layer 40 and the semiconductor layers 30, for example to emit light. The first and second conductors 96, 98 can be made in a common step using photolithographic processes including patterned photoresists and of common materials, for example a metal, a metal alloy, a conductive ink, aluminum, silver, gold, titanium, tantalum, tin, platinum, nickel, or palladium.

Figure 18:
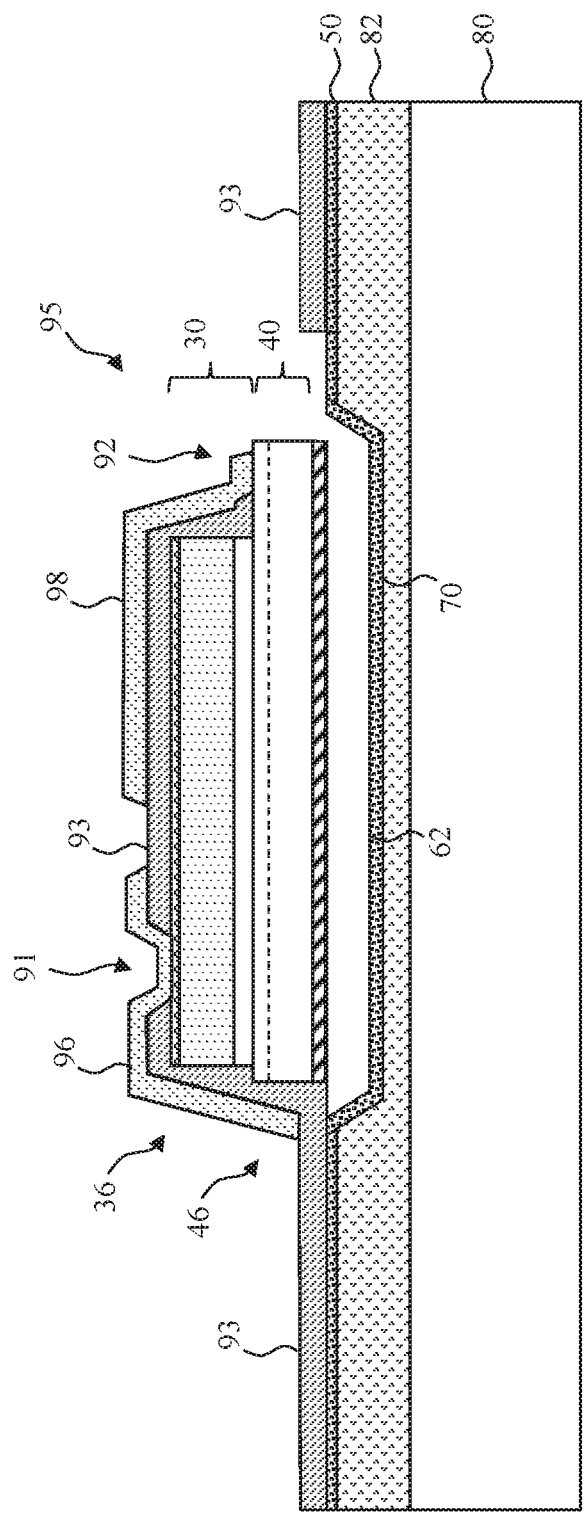

At least a portion of the release layer 60 is removed in step 185 and as shown in FIG. 18 to form a printable semiconductor element 95. The patterned release layer 61 can be removed in a variety of ways and using a variety of materials. The removed patterned release layer is indicated as element 62 but refers to the space from which the patterned release layer 61 was removed. In one embodiment, the patterned release layer 61 is removed by etching, for example with a liquid or a gas, for example using materials such as $H_2O_2$, $XeF_2$, HCl, TMAH, or O plasma. In an embodiment, the patterned release layer 61 is or includes Ge and the patterned release layer 61 is removed using $H_2O_2$ or $XeF_2$. In another embodiment, the patterned release layer 61 is or includes Si and the patterned release layer 61 is removed using $XeF_2$. In another embodiment, the patterned release layer 61 is or includes W or TiW and the patterned release layer 61 is removed using $H_2O_2$ or $XeF_2$. In yet another embodiment, the patterned release layer 61 is or includes Al or Ti and the patterned release layer 61 is removed using HCl or mixtures including HCl. In a further embodiment, the patterned release layer 61 is or includes a lift-off resist and the patterned release layer 61 is removed using TMAH-based developers (developers including trimethylammonium hydroxide). In yet a further embodiment, the patterned release layer 61 is or includes organic materials, polymers, epoxy, or polyimides and the patterned release layer 61 is removed using oxygen plasma. The removal process can be performed at a temperature greater than room temperature.

Figure 19:
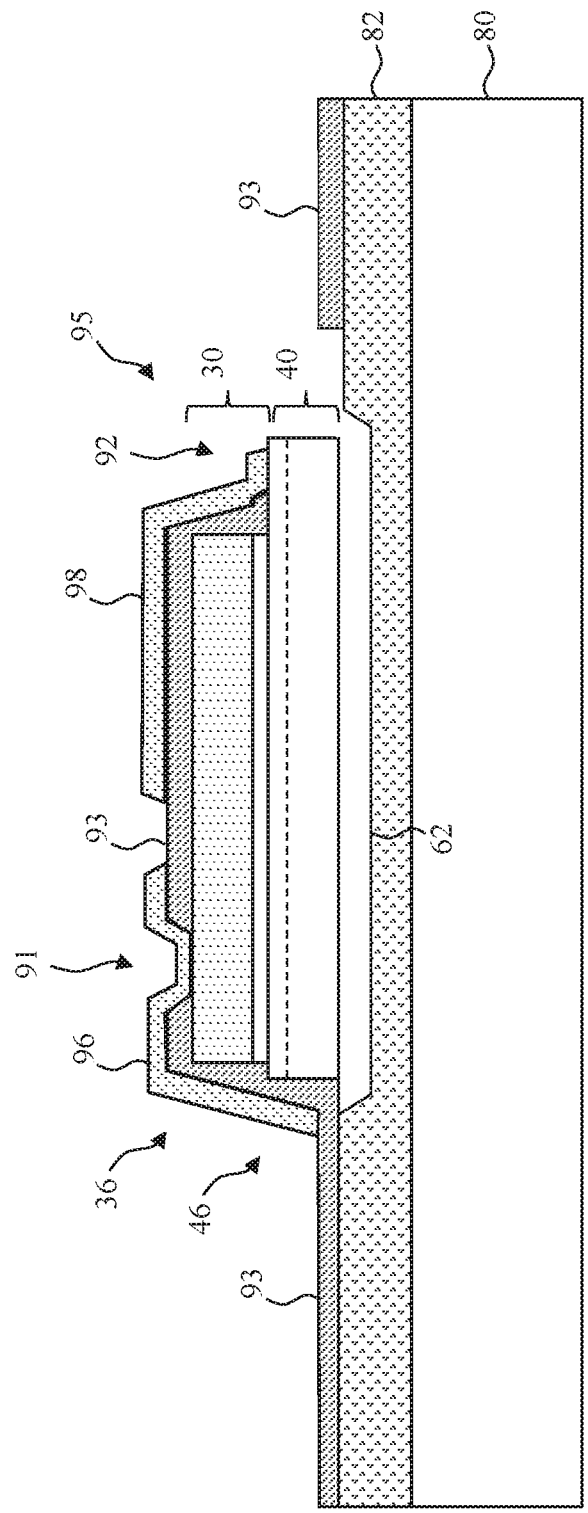
FIG. 19 is a cross section corresponding to FIG. 18 of a structure without optional layers in accordance with an embodiment of the present invention.
Figure 20:
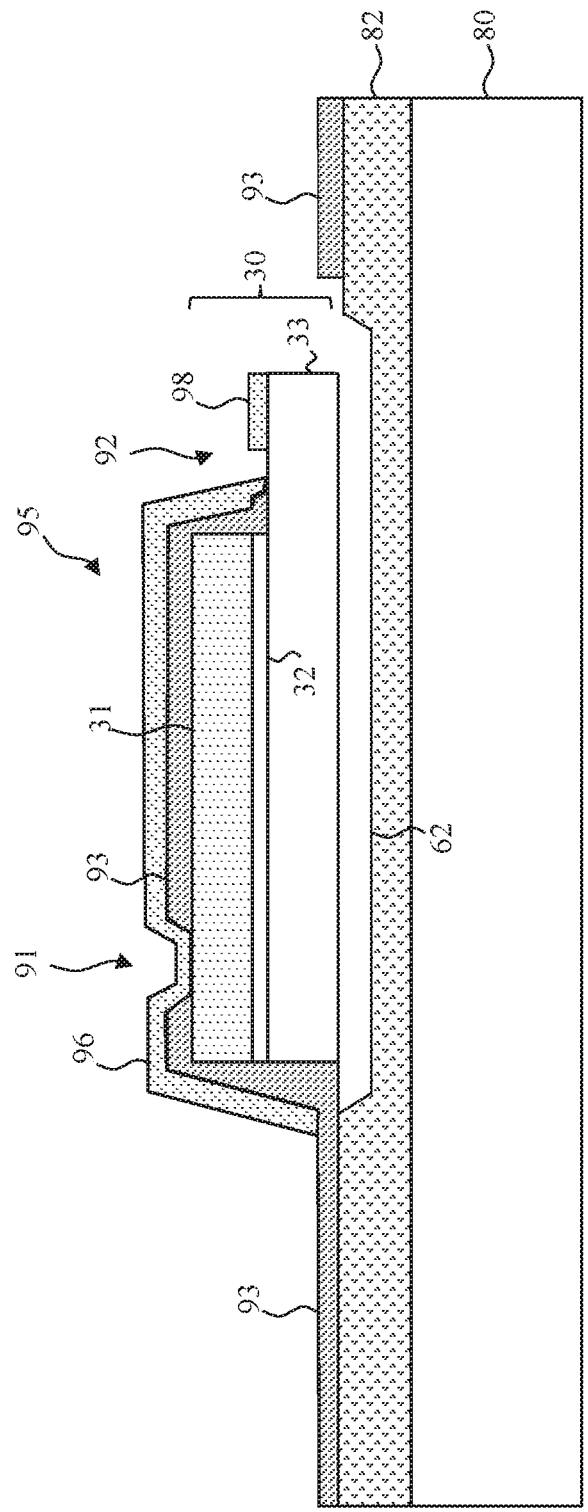
FIGS. 20-22 are cross sections of alternative printable semiconductor structures in accordance with embodiments of the present invention.

FIG. 18 illustrates a printable semiconductor element 95 constructed using methods of the present invention. FIG. 19 illustrates a comparable structure without the optional capping and etch-stop layers 70, 50. The printable semiconductor elements 95 of FIGS. 18 and 19 both rely upon the conductor layer 40 to act as an electrode that supplies current to the printable semiconductor element 95 and enables it to operate. Referring to FIG. 20 in an alternative embodiment, the conductor layer 40 is replaced with a semiconductor layer 33 providing current transport. The current-transport semiconductor layer 33 includes materials chosen to provide good electrical conductivity and transparency, for example to enable light emitted from the semiconductor layer 30 to pass into and through the current-transport semiconductor layer 33. As shown in FIG. 20, this structure has the advantage of encapsulating the light-emissive portions of the semiconductor layers (e.g., the n- and p-doped semiconductor layers 31, 32) with the first conductor 96. If the first conductor 96 is formed of a reflective metal such as silver or aluminum, any light emitted towards the first conductor 96 is reflected back through the current-transport semiconductor layer 33 and thence out of the semiconductor layers 30, improving the device brightness and efficiency. To enable an electrical connection to the current-transport semiconductor layer 33, the current-transport semiconductor layer 33 extends beyond the n- and p-doped semiconductor layers 31, 32 to enable the second conductor 98 to connect to the second contact 92 on the current-transport semiconductor layer 33.

Therefore, in various embodiments of the present invention, a method of making an inorganic semiconductor structure suitable for micro-transfer printing includes providing a growth substrate 10, forming one or more semiconductor layers 30 on the growth substrate 10, forming a patterned release layer 61 on the conductor layer(s), bonding a handle substrate 80 to the patterned release layer 61, removing the growth substrate 10, removing a portion of the semiconductor layer(s) 30 to form a semiconductor mesa 36 within the area defined by the patterned release layer 61, forming a dielectric layer 90 on the exposed portions of the semiconductor mesa 36 and patterned release layer 61, patterning the dielectric layer 90 to expose first and second contacts 91, 92, and an entry portion 64 of the patterned release layer 61, forming a conductive layer 94 on the patterned dielectric layer 93, the first contact 91, and the second contact 92, patterning the conductive layer 94 to form a first conductor 96 in electrical contact with the first contact 91 and a second conductor 98 in electrical contact with the second contact 92, the first conductor 96 electrically separate from the second conductor 98, and removing at least a portion of the patterned release layer 61. In an embodiment, the semiconductor layers 30 include one or more light-emitting layers and a current-transport layer 33 adjacent to the patterned release layer 61 that extends beyond the light-emitting layers and the second contact 92 is on the current-transport semiconductor layer 33. The current-transport layer 33 can also be considered a conductor layer 40.

Figure 21:
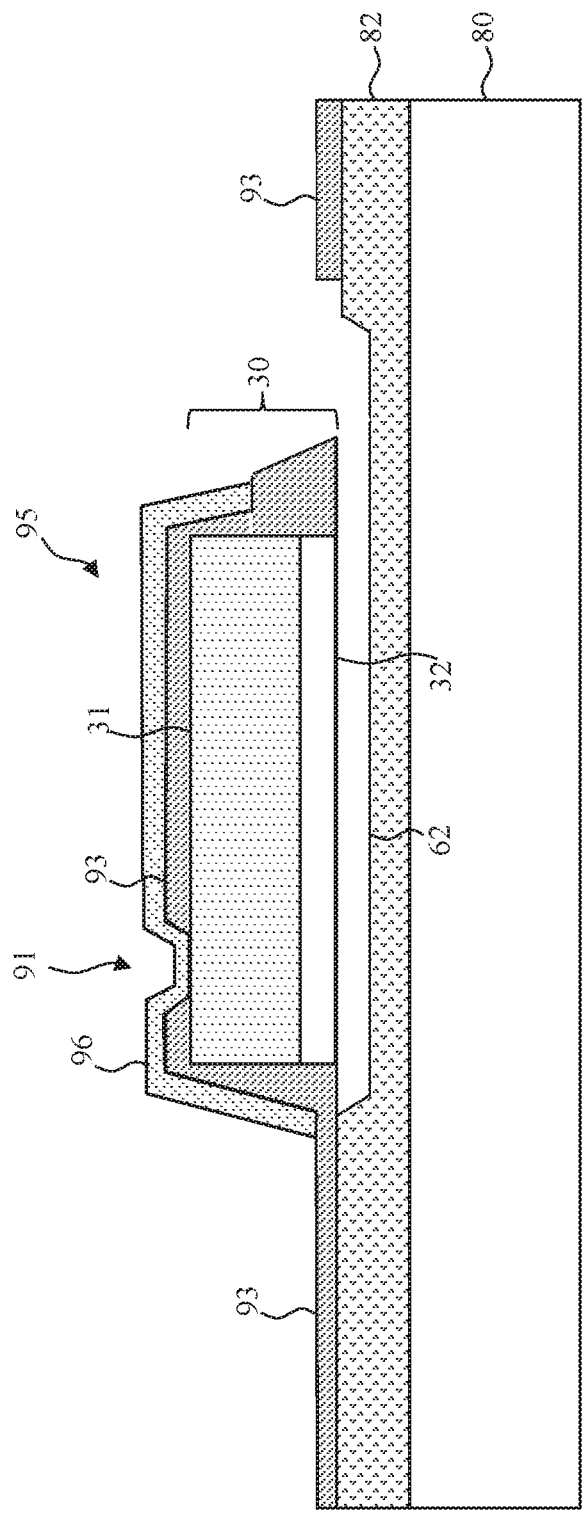

Referring to FIG. 21, in yet another embodiment, a separate conductor layer 40 or current-transport layer 33 is not provided and the non-native destination substrate to which the semiconductor element 95 is transfer printed includes a conductor or electrode that is electrically connected to the semiconductor layer 30 after the printable semiconductor element 95 is printed. Thus, in such an embodiment, a method of making an inorganic semiconductor structure suitable for micro-transfer printing includes providing a growth substrate 10, forming one or more semiconductor layers 30 on the growth substrate 10, forming a patterned release layer 61 on one or more of the semiconductor layers 30, bonding a handle substrate 80 to the patterned release layer 61, removing the growth substrate 10, removing a portion of the semiconductor layer(s) 30 to form a semiconductor mesa 36 within the area defined by the patterned release layer 61, forming a dielectric layer 90 on the exposed portions of the semiconductor mesa 36 and patterned release layer 61, patterning the dielectric layer 90 to expose at least a first contact 91 and an entry portion 64 of the patterned release layer 61, forming a conductive layer 94 on the patterned dielectric layer 93 and the first contact 91, patterning the conductive layer 94 to form a first conductor 96 in electrical contact with the first contact 91, and removing at least a portion of the patterned release layer 61.

Figure 22:
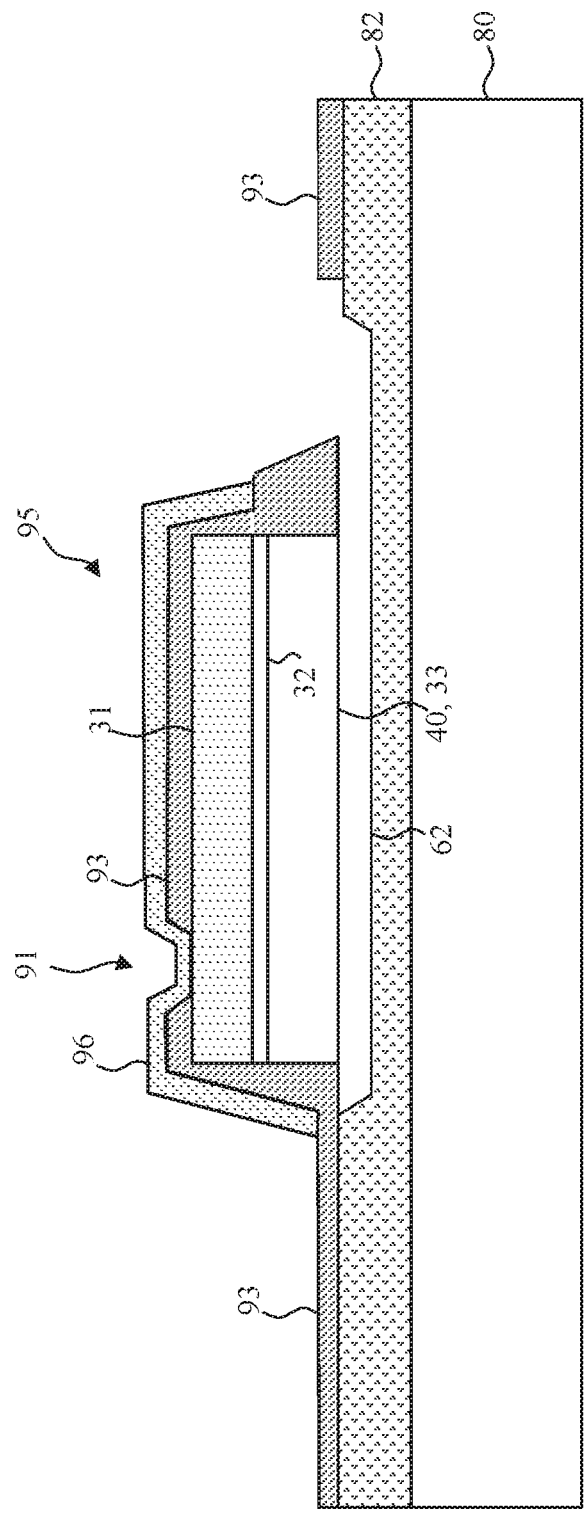
Figure 23:
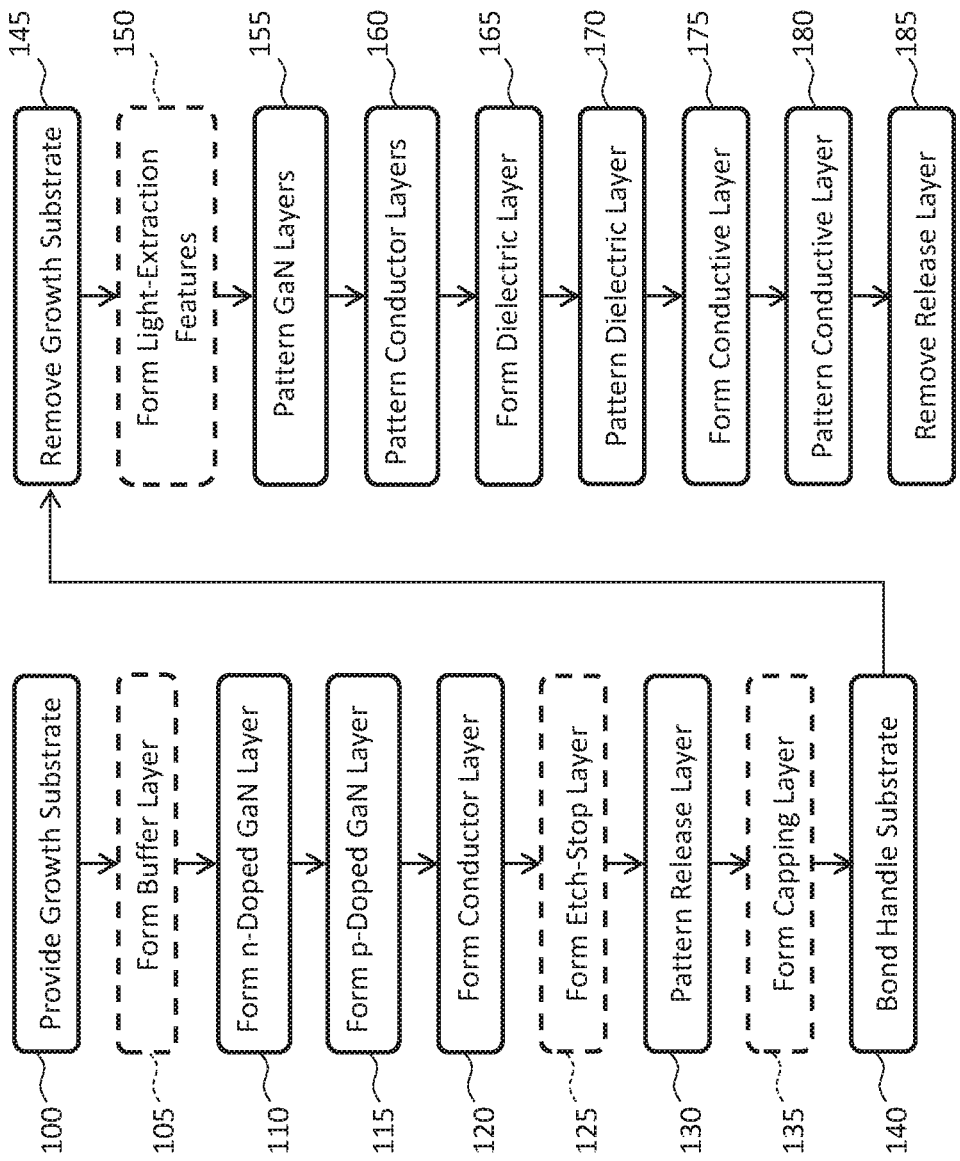
FIG. 23 is a flow chart illustrating an embodiment of the present invention.

In yet another embodiment, and as shown in FIG. 22, a conductor layer 40 is provided. The conductor layer can be a current-transport semiconductor layer 33 or a non-semiconductor layer such as a thin metallic or metallic oxide conductor layer 40 such as ITO, with or without sub-layers. The conductor layer can include a semi-transparent sub-layer (e.g. first conductive sub-layer 41) to provide an optical cavity in the printable semiconductor element 95. Thus, in this case, one or more conductor layer(s) 40 are formed on the one or more semiconductor layers 33 and then a portion of the conductor layer(s) 40 removed to form a conductor mesa 46 within the area defined by the patterned release layer 61. The conductor mesa 46 can, but need not, extend beyond the semiconductor mesa 36. The conductor layer 40 and semiconductor layer(s) 30 can form an optical cavity in which light emitted from the semiconductor layers 30 constructively interferes at a desired emission frequency.

The printable semiconductor element 95 made by methods of the present invention can include a variety of semiconductor structures, including a diode, a light-emitting diode (LED), a transistor, or a laser.

In an embodiment of the present invention, the printable semiconductor elements 95 have a length greater than width, for example having an aspect ratio greater than or equal to 2, 4, 8, 10, 20, or 50, and first and second electrical contacts 91, 92 that are adjacent to the ends of the printable semiconductor elements 95 along the length of the printable semiconductor elements 95. This structure enables low-precision manufacturing processes to electrically connect wires to the first and second electrical contacts 91, 92 to the first and second conductors 96, 98 without creating registration problems and possible unwanted electrical shorts or opens.

At times the present disclosure describes formation of a single semiconductor element or structure (e.g., a micro-device). The same techniques and methods may be used to form arrays of these elements, devices, and/or structures such that multiple micro-devices may be micro transfer printed to a destination substrate from a single substrate (e.g., handle substrate 80). Thus, the present disclosure contemplates the formation and micro transfer printing of arrays of micro-devices using the methods and techniques described herein. When formation of a single structure is described herein, it is contemplated that the same steps may be performed to an array of structures at the same time, thereby enabling the formation of arrays of micro-devices for micro transfer printing to a destination substrate. For example, micro LEDs can be formed on their native substrate with a resolution of approximately 3000 micro LEDs per square inch (e.g., 2500-3100, 2900-3500 micro LEDs per square inch).

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

The invention has been described in detail with particular reference to certain embodiments thereof, but it will be understood that variations and modifications can be effected within the spirit and scope of the invention.

PARTS LIST 10 growth substrate
20 buffer layer
30 semiconductor layer
31 n-doped GaN semiconductor layer
32 p-doped GaN semiconductor layer
33 current-transport semiconductor layer
35 structured surface
36 semiconductor mesa
40 conductor layer
41 first conductive sub-layer
42 second conductive sub-layer
46 conductor mesa
50 etch-stop layer
60 release layer
61 patterned release layer
62 etched release layer
64 entry portion of release layer
70 capping layer
80 handle substrate/handle wafer
82 adhesive
90 dielectric layer
91 first contact
92 second contact
93 patterned dielectric layer
94 conductive layer
95 printable semiconductor element
96 first conductor
98 second conductor
100 provide growth substrate step
105 optional form buffer layer step
110 form n-doped GaN layer step
115 form p-doped GaN layer step
120 form conductor layer step
125 optional form etch-stop layer step
130 form and pattern release layer step
135 optional form capping layer step
140 bond handle substrate step
145 remove growth substrate step
150 optional for light-extraction features step
155 pattern GaN layers step
160 pattern conductor layers step
165 form dielectric layer step 170 pattern dielectric layer step
175 form conductive layer step
180 pattern conductive layer step
185 remove release layer step

What is claimed:

1. An inorganic semiconductor structure suitable for micro-transfer printing, comprising:
one or more semiconductor layers;
a conductor layer formed on the one or more semiconductor layers;
a patterned release layer formed on the conductor layer; and
a handle substrate bonded to the release layer,
wherein the conductor layer is in electrical contact with the one or more semiconductor layers over the extent of the one or more semiconductor layers,
wherein the one or more semiconductor layers comprise one or more light-emitting layers and a current-transport layer adjacent to the patterned release layer that extends beyond the one or more light-emitting layers.

2. An inorganic semiconductor structure suitable for micro-transfer printing, comprising:
one or more semiconductor layers;
a conductor layer formed on the one or more semiconductor layers;
a patterned release layer formed on the conductor layer; and
wherein the one or more semiconductor layers form a semiconductor mesa within the area defined by the patterned release layer;
wherein a portion of the conductor layer forms a conductor mesa beneath the semiconductor mesa that extends past at least one edge of the semiconductor mesa and exposes a portion of the patterned release layer around the conductor mesa.

3. The inorganic semiconductor structure of claim 1, wherein the one or more semiconductor layers include an n-doped semiconductor layer and a p-doped semiconductor layer formed on the n-doped semiconductor layer.

4. The inorganic semiconductor structure of claim 3, wherein the conductor layer is formed on the p-doped semiconductor layer.

5. The inorganic semiconductor structure of claim 1, comprising a growth substrate on which the one or more semiconductor layers are formed.

6. The inorganic semiconductor structure of claim 5, wherein the one or more semiconductor layers include an n-doped semiconductor layer and a p-doped semiconductor layer formed on the n-doped semiconductor layer, and the n-doped semiconductor layer is formed on the growth substrate.

7. An inorganic semiconductor structure suitable for micro-transfer printing, comprising:
one or more semiconductor layers;
a conductor layer formed on the one or more semiconductor layers;
a patterned release layer formed on the conductor layer; and
wherein the one or more semiconductor layers form a semiconductor mesa within the area defined by the patterned release layer, and
wherein the conductor layer is in electrical contact with the one or more semiconductor layers over the extent of the one or more semiconductor layers,
wherein the one or more semiconductor layers comprise one or more light-emitting layers and a current-transport layer adjacent to the patterned release layer that extends beyond the one or more light-emitting layers.

8. The inorganic semiconductor structure of claim 7, wherein the one or more semiconductor layers include an n-doped semiconductor layer and a p-doped semiconductor layer formed on the n-doped semiconductor layer.

9. The inorganic semiconductor structure of claim 8, wherein the conductor layer is formed on the p-doped semiconductor layer.

10. The inorganic semiconductor structure of claim 7, comprising a handle substrate bonded to the patterned release layer.

11. An inorganic semiconductor structure suitable for micro-transfer printing, comprising:
one or more semiconductor layers and a conductor layer formed on the one or more semiconductor layers, wherein the one or more semiconductor layers form a semiconductor mesa and wherein a portion of the conductor layer forms a conductor mesa beneath the semiconductor mesa that extends past at least one edge of the semiconductor mesa;
a dielectric layer on exposed portions of the conductor mesa, and the semiconductor mesa, wherein the dielectric layer is patterned to expose a first contact on the semiconductor mesa and a second contact on the conductor mesa;
a conductive layer on the patterned dielectric layer, the first contact, and the second contact, wherein the conductive layer is patterned to form a first conductor in electrical contact with the first contact and a second conductor in electrical contact with the second contact, the first conductor electrically separate from the second conductor.

12. The inorganic semiconductor structure of claim 11, wherein the one or more semiconductor layers comprise one or more light-emitting layers and a current-transport layer that extends beyond the light-emitting layers and wherein the second contact is on the current-transport semiconductor layer.

13. The inorganic semiconductor structure of claim 11, wherein the one or more semiconductor layers include an n-doped semiconductor layer and a p-doped semiconductor layer formed on the n-doped semiconductor layer.

14. The inorganic semiconductor structure of claim 13, wherein the conductor layer is formed on the p-doped semiconductor layer.

15. The inorganic semiconductor structure of claim 14, wherein the conductor layer forms a first conductive sub-layer having first conductive materials on the p-doped semiconductor layer and a second conductive sub-layer having second conductive materials on the first conductive sub-layer.

16. The inorganic semiconductor structure of claim 2, comprising a dielectric layer on the exposed portion of the patterned release layer, the conductor mesa, and the semiconductor mesa.

17. The inorganic semiconductor structure of claim 16, wherein the dielectric layer is patterned to expose a first contact on the semiconductor mesa, a second contact on the conductor mesa, and an entry portion of the patterned release layer.

18. The inorganic semiconductor structure of claim 17, comprising a conductive layer on the patterned dielectric layer, the first contact, and the second contact.

19. The inorganic semiconductor structure of claim 18, wherein the conductive layer is patterned to form a first conductor in electrical contact with the first contact and a second conductor in electrical contact with the second contact, the first conductor electrically separate from the second conductor.

\* \* \* \* \*